US012813293B2

(12) United States Patent
Abesingha et al.

(10) Patent No.: US 12,813,293 B2
(45) Date of Patent: Nov. 24, 2026

(54) 3-D IC IN EMBEDDED DIE SUBSTRATE

(71) Applicant: Murata Manufacturing Co., Ltd., Kyoto (JP)

(72) Inventors: Buddhika Abesingha, Escondido, CA (US); Kouassi Sebastien Kouassi, San Diego, CA (US)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 914 days.

(21) Appl. No.: 18/085,003

(22) Filed: Dec. 20, 2022

(65) Prior Publication Data

US 2024/0203892 A1 Jun. 20, 2024

(51) Int. Cl.
*H10W 70/60* (2026.01)
*H10D 1/68* (2025.01)
(Continued)

(52) U.S. Cl.
CPC ............ *H10W 70/614* (2026.01); *H10D 1/68* (2025.01); *H10W 70/611* (2026.01);
(Continued)

(58) Field of Classification Search
CPC . H10W 20/021; H10W 20/20; H10W 10/014; H10W 10/17; H10W 70/611; H10W 70/65; H10W 10/061; H10W 10/181; H10W 90/00; H10W 90/724; H10W 72/252; H10D 86/201; H10D 62/115; H10D 86/01; H10D 30/6758;
(Continued)

(56) References Cited

U.S. PATENT DOCUMENTS 4,584,074 A * 4/1986 Sterling ................. H01G 13/00
204/488
2004/0140551 A1* 7/2004 Usui ....................... H10P 72/74
257/E23.07
(Continued)

OTHER PUBLICATIONS

Yang, Seong Ji, International Search Report and Written Opinion received from the KIPO dated Apr. 8, 2024 for appln. No. PCT/US2023/083603, 11 pgs.
(Continued)

*Primary Examiner* — Jessica S Manno
*Assistant Examiner* — Victor Joseph Lasasso
(74) *Attorney, Agent, or Firm* — Steinfl + Bruno LLP

(57) ABSTRACT

Three-dimensional (3-D) integrated circuit (IC) structures that are less constrained by the 2-D footprint of a conventional IC die. The novel 3-D IC structures combine 3-D ICs fabricated using various die and/or wafer bonding technologies with embedded die packaging technology. Embodiments include a 3-D IC structure including one or more 3-D IC dies embedded within a stack of one or more planar lamination layers. Combining one or more 3-D ICs with embedded die packaging technology results in a high degree of integration and miniaturization by taking advantage of electrical connection pad placement on both top and bottom surfaces of the 3-D ICs, enables better integration of active components as well as passive components, enables flexible partitioning of circuits and systems for 3-D integration, and enables low-profile 3-D IC structures that take advantage of economies of scale.

15 Claims, 11 Drawing Sheets

(51) Int. Cl.

| | |
|---|---|
| ***H10W 70/685*** | (2026.01) |
| ***H10W 72/59*** | (2026.01) |
| ***H10W 72/90*** | (2026.01) |
| ***H10W 90/00*** | (2026.01) |

(52) U.S. Cl.
CPC ......... *H10W 70/685* (2026.01); *H10W 72/90* (2026.01); *H10W 90/00* (2026.01); *H10W 72/59* (2026.01); *H10W 90/731* (2026.01)

(58) Field of Classification Search
CPC .... H10D 84/038; H10D 86/411; H10D 86/60; H10P 74/203; H10P 90/1906
See application file for complete search history.

(56) References Cited

U.S. PATENT DOCUMENTS

| | | | | |
|---|---|---|---|---|
| 2017/0162550 | A1 | 6/2017 | Das et al. | |
| 2018/0026008 | A1 | 1/2018 | Jeng et al. | |
| 2019/0304954 | A1 | 10/2019 | England | |
| 2020/0204159 | A1* | 6/2020 | Onodera | H03H 9/0514 |
| 2022/0022315 | A1 | 1/2022 | Song et al. | |
| 2022/0157785 | A1 | 5/2022 | Yu et al. | |

OTHER PUBLICATIONS

Elsherbini, et al., "Hybrid Bonding Interconnect for Advanced Heterogeneously Integrated Processors", 2021 IEEE 71st Electronic Components and Technology Conference (ECTC), pp. 1014-1019.

* cited by examiner

3-D IC IN EMBEDDED DIE SUBSTRATE

BACKGROUND

(1) Technical Field

The present invention relates to three-dimensional integrated circuit structures and circuits.

(2) Background

The electronics industry continues to strive for ever-increasing electronic functionality and performance in a wide variety of products, including (by way of example only) personal electronics (e.g., "smart" watches and fitness wearables), personal computers, tablet computers, wireless network components, televisions, cable system "set top" boxes, radar systems, and cellular telephones. Increased functionality and/or performance commonly translates to more transistors and other electronic components on an integrated circuit (IC) die. While the number of transistors per unit area of an IC die has increased over time as IC manufacturing process nodes have shrunk device dimensions, the two-dimensional (2-D) planar "footprint" of some IC dies has not decreased at the same rate, primarily owing to the use of more (albeit smaller) transistors to implement increased functionality and/or performance. The 2-D footprint of an IC die is one constraint on reducing the size of modules and circuit boards within products.

Accordingly, there is a need for higher-functionality integrated circuit structures that are less constrained by the 2-D footprint of an IC die.

SUMMARY

The present invention encompasses three-dimensional (3-D) integrated circuit (IC) structures that are less constrained by the 2-D footprint of a conventional IC die. The novel 3-D IC structures combine 3-D ICs fabricated using die and/or wafer bonding technologies with embedded die packaging technology, an advanced form of laminate technology. Combining one or more 3-D ICs with embedded die packaging technology results in a high degree of integration and miniaturization by taking advantage of electrical connection pad placement on both top and bottom surfaces of the 3-D ICs, enables better integration of active components and passive components in a single IC structure, enables flexible partitioning of circuits and systems for 3-D integration, and enables low-profile 3-D IC structures that take advantage of economies of scale.

Embodiments include a 3-D IC structure including one or more 3-D IC dies embedded within a stack of one or more planar lamination layers. Other embodiments include a 3-D IC structure having a top surface and a bottom surface opposite the top surface, the 3-D IC structure including: one or more 3-D IC dies embedded within a stack of one or more planar lamination layers, wherein at least one of the one or more 3-D IC dies includes a plurality of contact die-pads on a first surface and on a second surface opposite the first surface; and one or more connection pads formed on at least one of the top surface and a bottom surface of the 3-D IC structure.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION

Figure 1A:
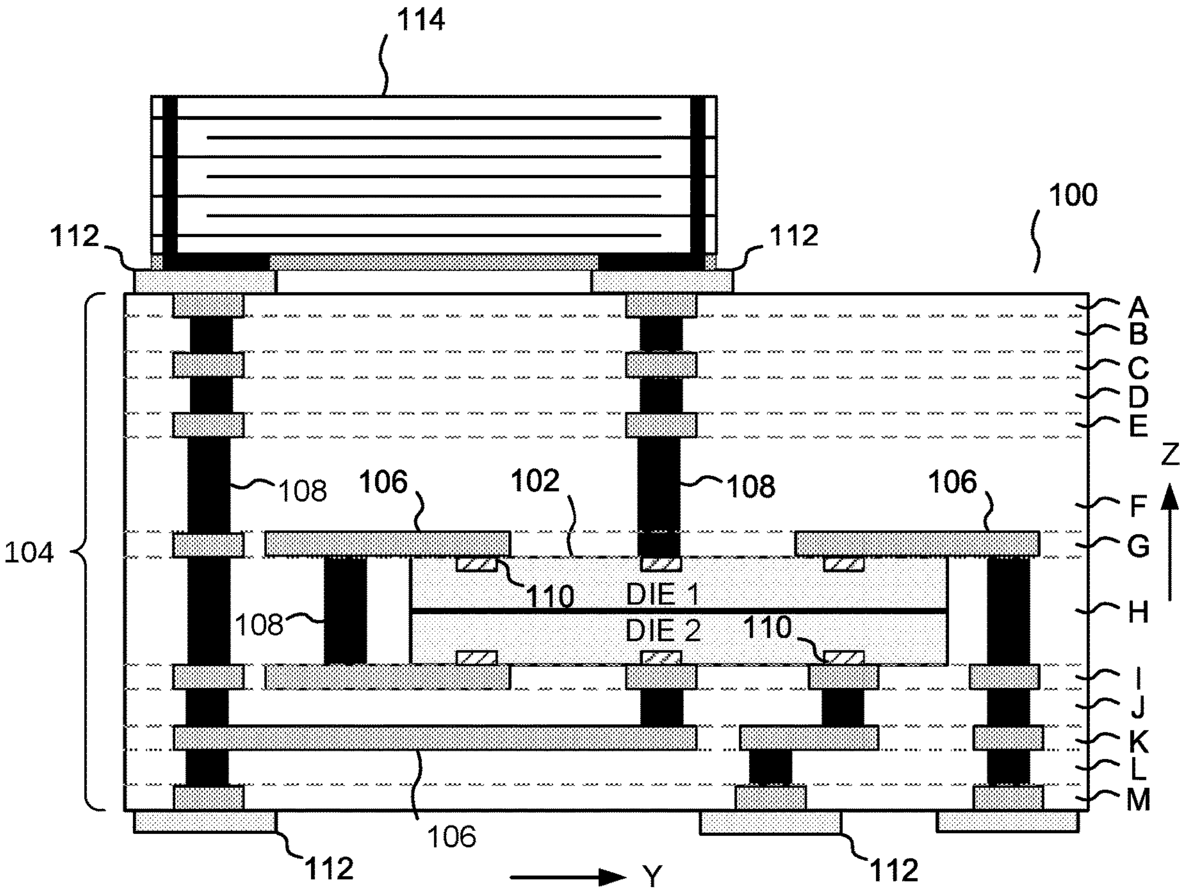
FIG. 1A is a cross-sectional side view, along a Y-Z dimensional plane, of one embodiment of a 3-D IC structure in accordance with the present invention.

The present invention encompasses three-dimensional (3-D) integrated circuit (IC) structures that are less constrained by the 2-D footprint of a conventional IC die. The novel 3-D IC structures combine 3-D ICs fabricated using die and/or wafer bonding technologies with embedded die packaging technology, an advanced form of laminate technology. Combining one or more 3-D ICs with embedded die packaging technology results in a high degree of integration and miniaturization by taking advantage of electrical connection pad placement on both top and bottom surfaces of the 3-D ICs, enables better integration of active components as well as passive components, enables flexible partitioning of circuits and systems for 3-D integration, and enables low-profile 3-D IC structures that take advantage of economies of scale.

MOSFET IC Fabrication

It may be useful to review how 2-D metal-oxide-semiconductor field effect transistor (MOSFET) circuitry is fabricated using a conventional silicon-on-insulator (SOI) process. Starting with a wafer substrate, such as silicon, an insulating buried oxide (BOX) layer is formed, on which an active layer is formed, typically of doped silicon. On and/or within the active layer, one or more MOSFET structures are formed within the bounds of an individual IC die (unsingulated at this point). Each wafer substrate typically includes hundreds to thousands of unsingulated dies.

A MOSFET structure generally includes a mask-formed channel, a gate, a source, a drain, and isolation regions. The IC fabrication process up to this point is generally considered the front-end-of-line (FEOL) where individual devices (transistors, capacitors, resistors, inductors etc.) are patterned in or on the active layer. The FEOL generally covers everything up to (but not including) the deposition of metal interconnect layers, and may be regarded as fabrication of die substructures.

After the last FEOL step, a wafer contains multiple die regions each including isolated transistors without any interconnecting conductors. The back-end-of-line (BEOL) is the second portion of IC fabrication where the individual devices (transistors, capacitors, resistors, inductors, etc.) within a die region are interconnected with conductors formed as part of or spanning one or more metal interconnect layers. BEOL includes fabrication of electrical contacts (pads), vias, insulating layers (dielectrics), metal levels, and bonding sites for die-to-package connections. In some applications, "through-silicon vias" (TSVs) may be fabricated, each TSV passing through the wafer substrate between the active layer and a connection point, such as a bond pad.

Some BEOL fabrication processes or post-BEOL fabrication processes (e.g., as part of outsourced semiconductor assembly and test) allow application of a redistribution layer (RDL), which is generally an extra patterned conductive layer (commonly aluminum) on an IC die that makes the input/output (I/O) pads of an IC die available to be coupled to other locations of the die, and/or to another IC die, and/or to specialized packaging structures. The RDL may be formed on top of the "upper" BEOL superstructure of an IC die. In some cases (for example, for single-layer transfer or SLT die structures), the RDL may be formed adjacent to a primary circuit layer containing active FET regions after removal of the wafer substrate and re-attachment of the primary circuit layer and superstructure to a handle wafer.

Thus, a 2-D MOSFET IC die is essentially formed in two parts, a "lower" FEOL substructure and an "upper" BEOL superstructure formed within a die region of a wafer. After FEOL and BEOL processing, the wafer undergoes a number of additional known process steps, including dicing, testing, and packaging, to form multiple IC dies. While a MOSFET IC die is actually made by building up multiple layers, and thus technically is a three-dimensional structure, the layers are extremely thin, and by convention such MOSFETs are considered to be two-dimensional structures.

3-D Stacking Technology

In order to shrink the 2-D footprint of an IC die, a number of 3-D technologies have been developed that have focused on stacking and bonding aligned IC dies originally fabricated on different wafers (also known as wafer-to-wafer bonding), stacking and bonding individual IC dies on non-singulated IC dies on a wafer (also known as die-to-wafer bonding), and stacking and bonding an individual IC die on another IC die (also known as die-to-die bonding). One such technology may be referred to as "hybrid bonding interconnect" (HBI), in which circuitry is fabricated on different wafers or dies and then vertically stacked and interconnected in a 3-D structure. Bonding of the two wafers/dies generally uses both dielectric materials (e.g., silicon dioxide, SiCN, SiCOH, and/or analogous alloys) and conductive interconnect materials (e.g., copper, aluminum, and/or their alloys). In general, a high density of interconnects between the top and bottom wafers/dies is desirable to achieve good communications between them. The interconnect pitch can be between about 0.2 to 10 μm, and preferably in approximately the 2-5 μm range. HBI technology has a demonstrated high interconnect density, is a planar technology that does not require underfill or carrier wafer integration, and enables formation of interconnects between two IC wafers/dies during the bonding stage of processing at relatively low temperatures (e.g., <400)° ° C.

Another stacking-and-bonding technology for shrinking the 2-D footprint of an IC die utilizes thermo-compression bonding of pillar bumps on mated ICs. Thermo-compression bonding is also referred to as diffusion bonding, pressure joining, thermocompression welding, or solid-state welding. Pillar bumps may be made of copper with a contact-end coated in nickel and then silver or tin (e.g., solder). Two IC chips that include corresponding aligned pillar bumps are mated together while applying force and heat simultaneously, thereby creating an electrical coupling between mated conductors. Atoms migrate between the metallic crystal lattices of the two components based on crystal lattice vibration, which adheres the interfaces together. This method enables direct electrical interconnection between two structures without additional steps.

Another technology for shrinking the 2-D footprint of an IC die utilizes 3-D embedded die packaging. For example, an individual IC die may be embedded in a substrate layer (typically an organic material such as a laminate), with conductive (e.g., copper) interconnects or "vias" electrically coupling to connection points (e.g., die-pads, connection pads, bump, or pins) for internal and/or external connections. The embedded-die substrate layer on which an IC die is embedded essentially functions as a printed circuit board. One method of building up connections is by using conventional BEOL processes (e.g., sequential formation of one or more dielectric layers or conductive layers around an embedded IC die, including formation of interlayer connections such as vias). Another method of building up connections is by laminating multiple layers designed to accommodate an embedded IC die and containing horizontal and vertical conductors. After initial lamination, additional laminated layers may be added and/or conventional BEOL processes may be applied post-lamination to form additional structures, layers, and/or connection pads.

Example 3-D IC Structure

Figure 1B:
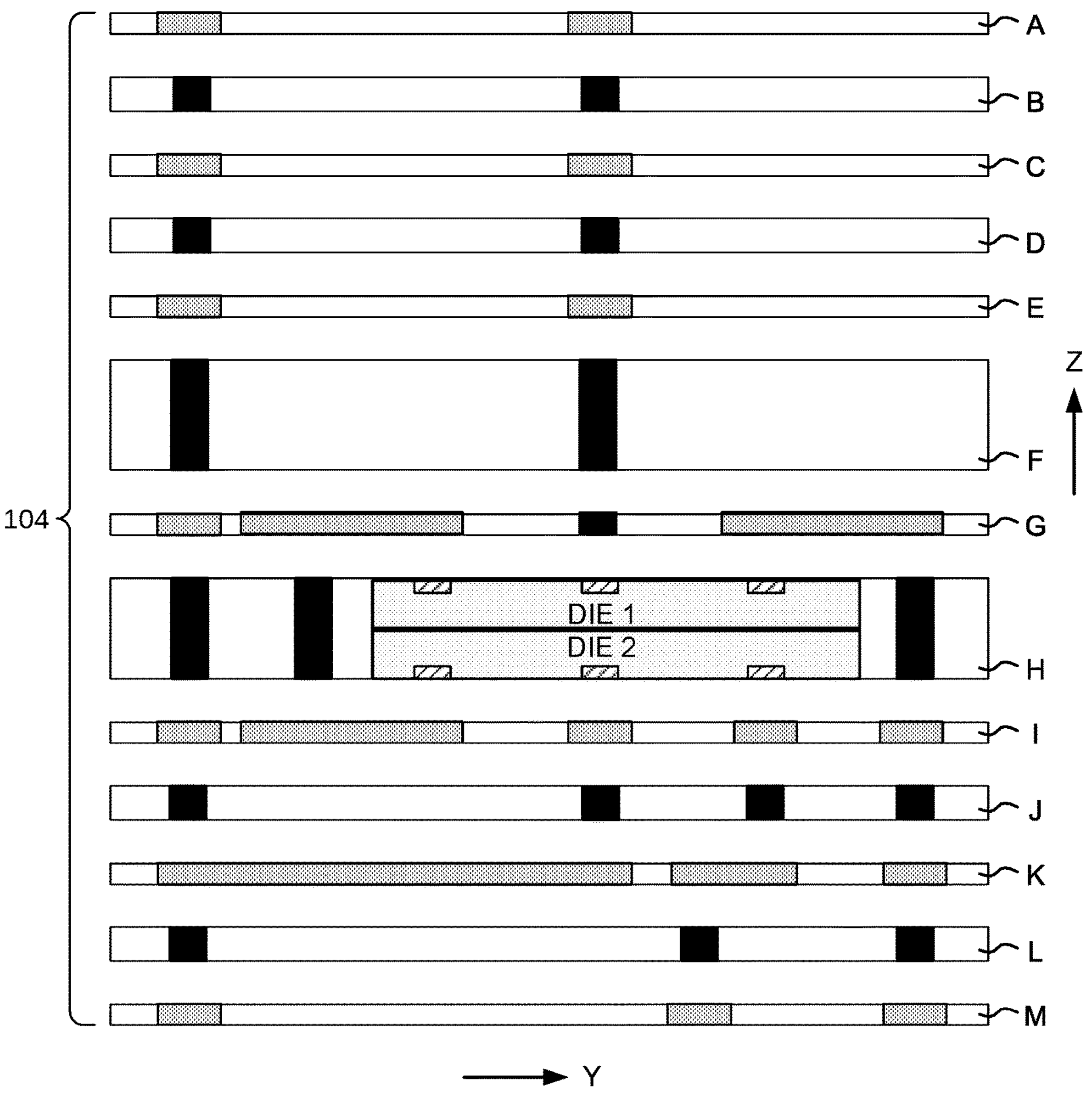
FIG. 1B is an expanded cross-sectional side view, along a Y-Z dimensional plane, of the one or more planar lamination layers of the 3-D IC structure of FIG. 1A.

FIG. 1A is a cross-sectional side view, along a Y-Z dimensional plane, of one embodiment of a 3-D IC structure 100 in accordance with the present invention. A 3-D IC die 102 is embedded within a substrate layer comprising a stack of one or more planar lamination layers 104 (each lamination layer A-M indicated by a bracketing dashed lines) that include horizontal (inplane) conductors 106 and vertical (perpendicular-to-plane) conductors or vias 108. FIG. 1B is an expanded cross-sectional side view, along a Y-Z dimensional plane, of the one or more planar lamination layers 104 of the 3-D IC structure 100 of FIG. 1A. Note that the vertical dimensions of the lamination layers 104 are not to scale, particularly the lamination layer 104 in which the 3-D IC die 102 is embedded.

In the illustrated example, some of the horizontal conductors 106 contact die-pads 110 that form part of the 3-D IC die 102. Connection pads 112 are shown formed on the top and bottom surfaces of the lamination layers 104, thus allowing connections to the 3-D IC die 102 and other components (e.g., resistors, capacitors including supply capacitors, inductors) that may be included within the lamination layers 104. In some embodiments, one or more connection pads 112 may be formed on only one of the top and bottom surfaces of the lamination layers 104. In some embodiments, the connection pads 112 may be omitted from a surface that is to be subjected to hybrid bonding or the like.

In some embodiments, external components may be attached to the exterior of the 3-D IC structure 100. For example, in FIG. 1A, a multi-layer ceramic capacitor (MLCC) 114 is shown attached to two of the top surface connection pads 112. Details of one type of MLCC are set forth below. However, embodiments of the present invention are not limited to use of MLCC capacitors, but may include other known capacitor structures, including (but not limited to), ceramic capacitors, tantalum capacitors, aluminum electrolytic capacitors, capacitors built in a silicon substrate, and conductive polymer capacitors. Further, other types of electronic, electromechanical, and/or electro-optical components, such as inductors, resistors, sensors, micro-electro-mechanical system (MEMS) devices, photo detectors or emitters, etc., may be attached in a similar manner to the connection pads 112 of the 3-D IC structure 100.

The completed 3-D IC structure 100 with attached external components may be overmolded to form a robust chip-scale package (CSP) that may be utilized in subsequent processes like a 2-D integrated circuit, such as by attachment to other structures (e.g., interposers, die modules, or printed circuit boards).

Figure 1C:
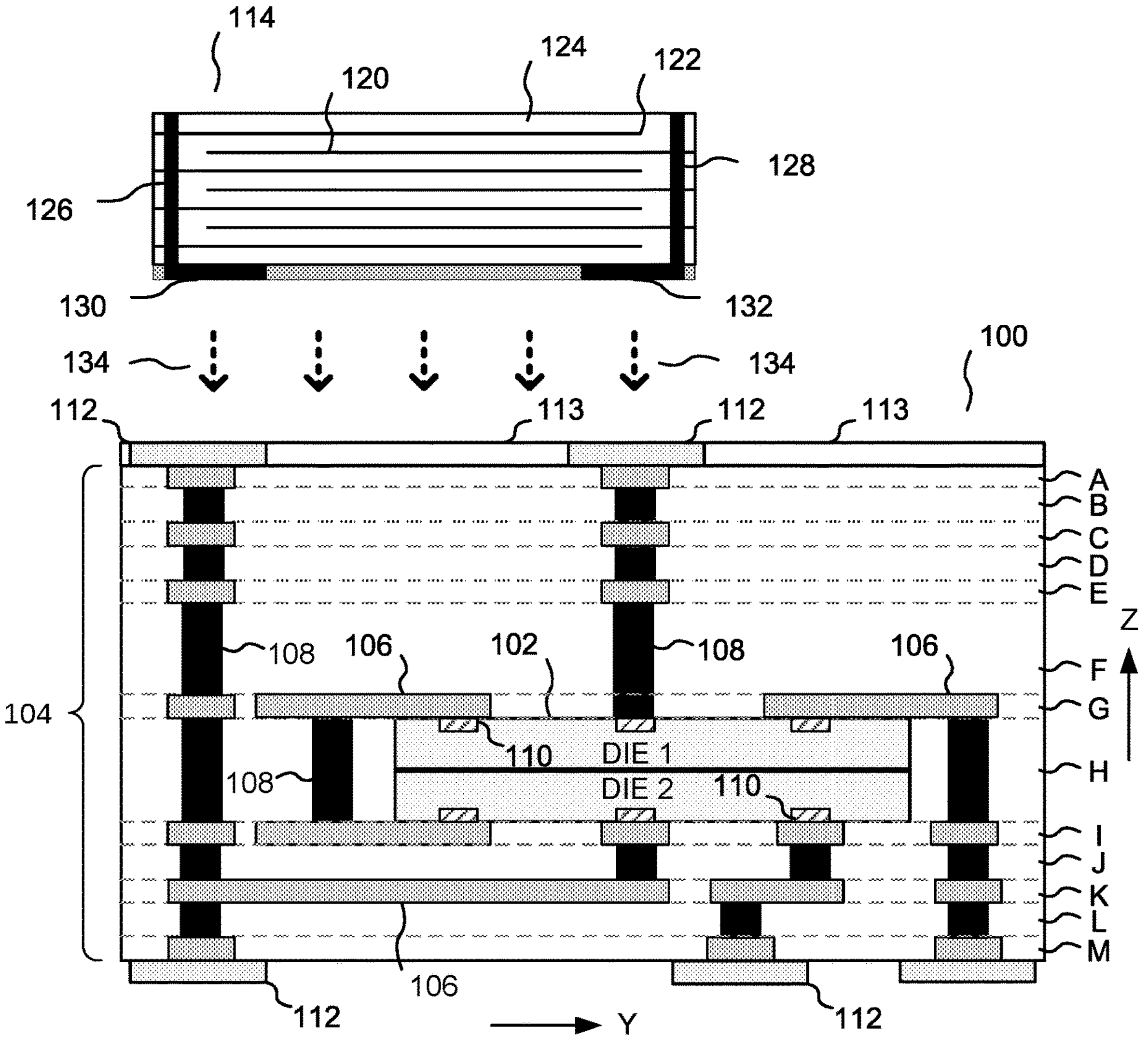
FIG. 1C is a cross-sectional side view, along a Y-Z dimensional plane, of the 3-D IC structure of FIG. 1A, showing a first method of attachment of an MLCC.

FIG. 1C is a cross-sectional side view, along a Y-Z dimensional plane, of the 3-D IC structure 100 of FIG. 1A, showing a first method of attachment of an MLCC 114. The body of the MLCC 114 includes interdigitated electrically-isolated conductive plates (also known as internal electrodes) 120, 122 separated by a ceramic dielectric 124. Internal via-type main electrodes 126, 128 (rather than external end-cap main electrodes) connect to respective sets of the internal electrodes 120, 122. An advantage of the internal main electrodes 126, 128 is that they are protected from possible unintended electrical contacts to the sides of the capacitor MLCC 114. Each of the internal via-type main electrodes 126, 128 is coupled on at least one surface (a "bonding surface") of the MLCC 114 to a corresponding connection pad 130, 132 suitable for forming hybrid bonds. Details regarding fabrication of an MLCC 114 are set forth below.

FIG. 1C shows the MLCC 114 positioned just before bonding, in which the MLCC 114 is moved into contact with the 3-D IC structure 100, as indicated by the arrows 134. The MLCC 114 is placed on and electrically coupled to respective connection pads 112 and associated dielectric of the 3-D IC structure 100. If HBI is the selected bonding technique, then the spaces between the connection pads 112 may be filled with a dielectric 113, since hybrid bonding creates bonds between corresponding dielectric materials and corresponding conductive interconnect materials and generally results in no void between the bonding surfaces. The MLCC 114 may be placed using die-to-die, die-to-wafer, or wafer-to-wafer (for example, using a reconstituted wafer bearing multiple MLCC's 114).

Figure 1D:
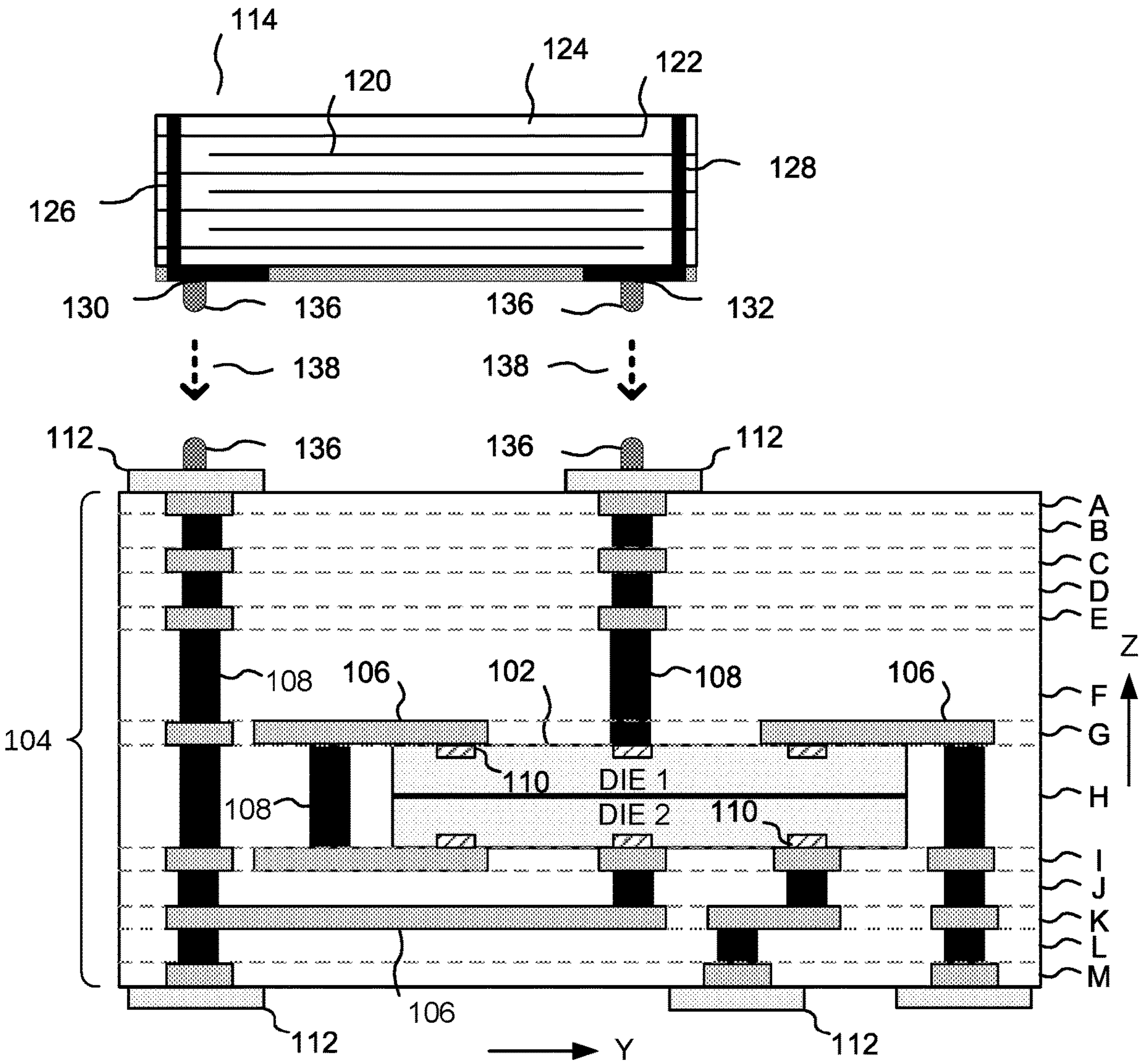
FIG. 1D is a cross-sectional side view, along a Y-Z dimensional plane, of the 3-D IC structure of FIG. 1A, showing a second method of attachment of an MLCC.

FIG. 1D is a cross-sectional side view, along a Y-Z dimensional plane, of the 3-D IC structure 100 of FIG. 1A, showing a second method of attachment of an MLCC 114. The 3-D IC structure 100 and the MLCC 114 in this example also include pillar bumps 140 formed on corresponding connection pads 112, 130, 132. Pillar bumps allow a finer pitch compared to solder bumps (typically at least twice as fine), which allows more connections between components within a specified 2-D planar footprint. The MLCC 114 is placed on and electrically coupled using thermo-compression bonding of aligned pillar bumps 140. FIG. 1D shows the MLCC 114 positioned just before bonding in which the MLCC 114 is moved into contact with the 3-D IC structure 100, as indicated by the arrows 138. The MLCC 114 may be placed using die-to-die, die-to-wafer, or wafer-to-wafer (for example, using a reconstituted wafer bearing multiple MLCC's 114).

3-D IC Examples

The 3-D IC die 102 embedded in the 3-D IC structure 100 of FIG. 1A may include active IC devices (e.g., MOSFETs) and/or integrated passive components (e.g., resistors, capacitors, inductors) depending on application needs. As FIG. 1A illustrates for the case of an MLCC 114, components (e.g., passive components such as resistors, capacitors, inductors, resonators, other IC dies, discrete devices, etc.) may also be attached and electrically connected to the 3-D IC structure 100 through the connection pads 112 of the 3-D IC structure 100. Such components may be connected to the embedded 3-D IC die 102 and/or other connection pads or package pins using routing layers available within and between the lamination layers 104 of the 3-D IC structure 100.

The 3-D IC die 102 of FIG. 1A may be fabricated in a number of different ways, examples of which are described with respect to FIGS. 2A-2E.

Figure 2A:
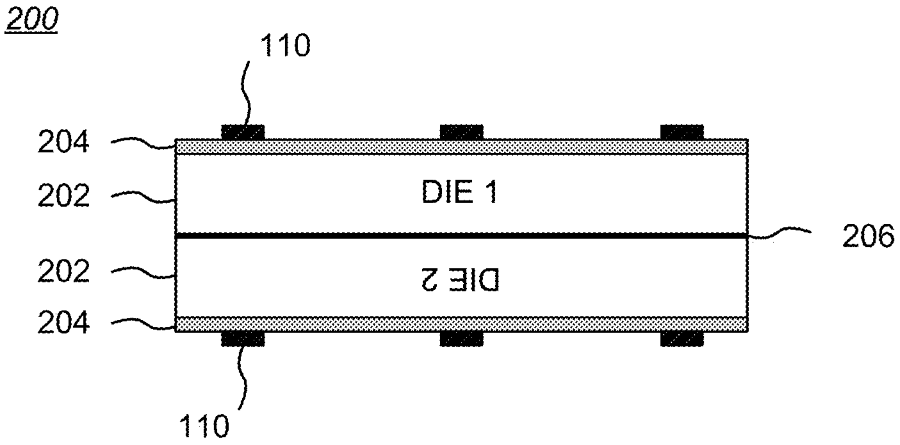
FIG. 2A is a cross-sectional side view of a first example 3-D IC die formed from two 2-D ICs, DIE 1 and DIE 2.

FIG. 2A is a cross-sectional side view of a first example 3-D IC die 200 formed from two 2-D ICs, DIE 1 and DIE 2. Each of DIE 1 and DIE 2 comprises an insulated region of a die or a substrate 202 on which is formed a substructure (e.g., active regions of the die formed by FEOL processes) and superstructure (e.g., interconnections formed by BEOL processes) 204 (shown in combined form) bearing contact die-pads 110. After fabrication as 2-D dies, the insulating substrates 202 of DIE 1 and DIE 2 are bonded together "back-to-back" along boundary 206. The 2-D dies may be placed in contact with each other using die-to-die, die-to-wafer, or wafer-to-wafer (for example, using a reconstituted wafer bearing multiple 2-D dies). The thickness of the combined dies will depend on the thickness of individual DIE 1 and DIE 2.

After bonding of DIE 1 and DIE 2, contact die-pads 110 are exposed on both the top and the bottom surfaces of the combined dies and thus enable a greater number of interconnections to the 3-D IC die 102 within the 3-D IC structure 100 compared to a conventional 2-D IC die. Other advantages of the 3-D IC die configuration of FIG. 2A include: each 2-D die keeps its contact die-pads 110 intact; performance critical circuits/devices (e.g., radio frequency switches) may be partitioned between DIE 1 and DIE 2 as appropriate for a particular application; and other support circuits may be partitioned between the two dies and routed using internal routing layers available in the embedded substrate technology.

Figure 2B:
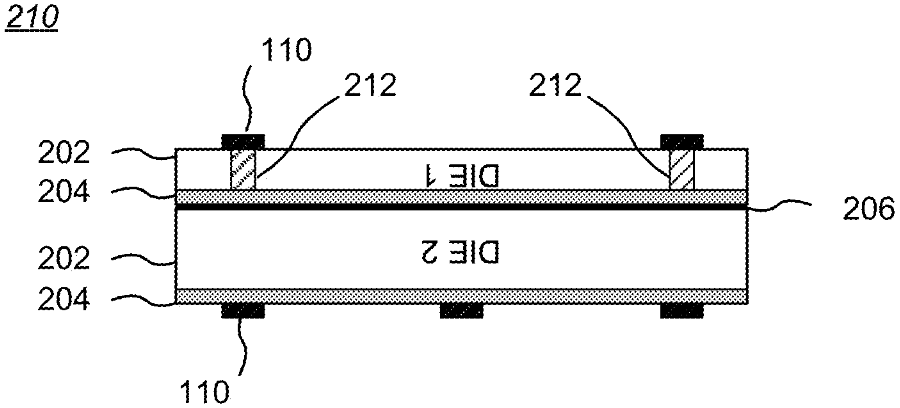
FIG. 2B is a cross-sectional side view of a second example 3-D IC die formed from two 2-D ICs, DIE 1 and DIE 2.

FIG. 2B is a cross-sectional side view of a second example 3-D IC die 210 formed from two 2-D ICs, DIE 1 and DIE 2. Each of DIE 1 and DIE 2 comprises an insulating substrate 202 on which is formed a substructure and superstructure 204 (shown in combined form). DIE 2 bears contact die-pads 110 on its combined substructure/superstructure 204. However, DIE 1 has been subjected to a single layer transfer (SLT) process that essentially inverts or "flips" DIE 1 and bonds the substructure/superstructure 204 of DIE 1 to the substrate 202 of DIE 2 (which may be thinned before bonding). The substrate 202 of DIE 1 may then be removed or thinned, and, if needed, vias 212 may be formed to connect the circuitry within the substructure/superstructure 204 of DIE 1 to "top" side contact die-pads 110. Advantages of the 3-D IC die 210 configuration of FIG. 2B include the possibility of achieving lower profiles for the final 3-D IC structure 100 due to removal of some or all of the substrate 202 of DIE 1 and optionally thinning the substrate 202 of DIE 2.

Figure 2C:
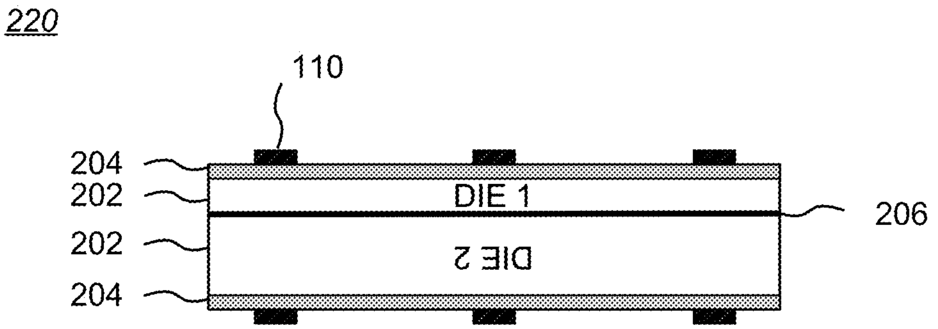
FIG. 2C is a cross-sectional side view of a third example 3-D IC die formed from two 2-D ICs, DIE 1 and DIE 2.

FIG. 2C is a cross-sectional side view of a third example 3-D IC die 220 formed from two 2-D ICs, DIE 1 and DIE 2. Each of DIE 1 and DIE 2 comprises an insulating substrate 202 on which is formed a substructure and superstructure 204 (shown in combined form) bearing contact die-pads 110. After fabrication as 2-D dies, one or both of DIE 1 and DIE 2 are subjected to a double layer transfer (DLT) process that essentially inverts or "flips" the die(s) and bonds the substructure/superstructure 204 of that die to a handle wafer (not shown), after which the insulating substrate 202 of the flipped die is thinned. Thereafter, the insulating substrates 202 of the flipped die(s) (DIE 1 and/or DIE 2) are bonded together "back-to-back" along boundary 206, and the handle wafer(s) is removed. The result is a 3-D IC die 220 that has a lower profile compared to the example of FIG. 2A due to thinning of the substrate 202 of DIE 1 and optionally thinning the substrate 202 of DIE 2.

Figure 2D:
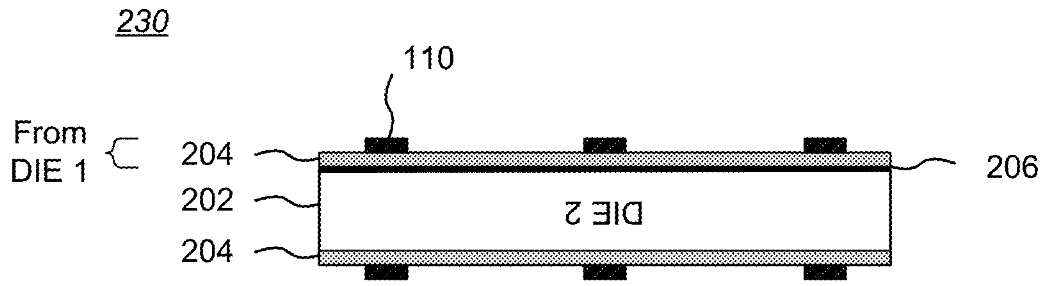
FIG. 2D is a cross-sectional side view of a fourth example 3-D IC die formed from two 2-D ICs, DIE 1 and DIE 2.

FIG. 2D is a cross-sectional side view of a fourth example 3-D IC die 230 formed from two 2-D ICs, DIE 1 and DIE 2. The fabrication process is similar to the DLT process associated with FIG. 2C, except that after bonding the substructure/superstructure 204 of DIE 1 to a handle wafer (not shown), the insulating substrate 202 of flipped DIE 1 is removed. Thereafter, the exposed backside of the substructure/superstructure 204 of flipped DIE 1 is bonded "back-to-back" to the insulating substrate 202 of DIE 2 along boundary 206 (note that the insulating substrate 202 of DIE 2 optionally may be thinned before the bonding process). The handle wafer of DIE 1 is then removed. The result is a 3-D IC die 230 that has a lower profile compared to the example of FIG. 2A due to removal of the substrate 202 of DIE 1 and optionally thinning the substrate 202 of DIE 2.

Figure 2E:
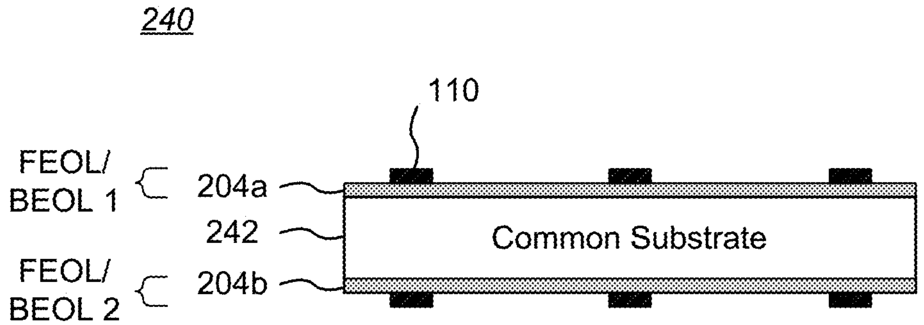
FIG. 2E is a cross-sectional side view of a fifth example 3-D IC die having substructure/superstructures formed on both sides of a single substrate.

FIG. 2E is a cross-sectional side view of a fifth example 3-D IC die 240 having substructure/superstructures formed on both sides of a single substrate 242. Using double-sided wafer processing techniques, the substrate 242 is processed sequentially (one side at a time) or in parallel to form a combined substructure/superstructure 204 on each side of the substrate 242. For example, a first side of the substrate 242 may be subjected to conventional FEOL and BEOL processes to form a combined substructure/superstructure 204*a* on the "top" side of the substrate 242, and thereafter a second side of the substrate 242 may be subjected to conventional FEOL and BEOL processes to form a combined substructure/superstructure 204*b* on the "bottom" side of the substrate 242. While two separate 2-D ICs are not involved, the result is a 3-D IC structure 100 that includes contact die-pads 110 on both the top and bottom of the 3-D IC structure 100, as well as a low profile structure.

Multiple Embedded 3-D ICs

Figure 3:
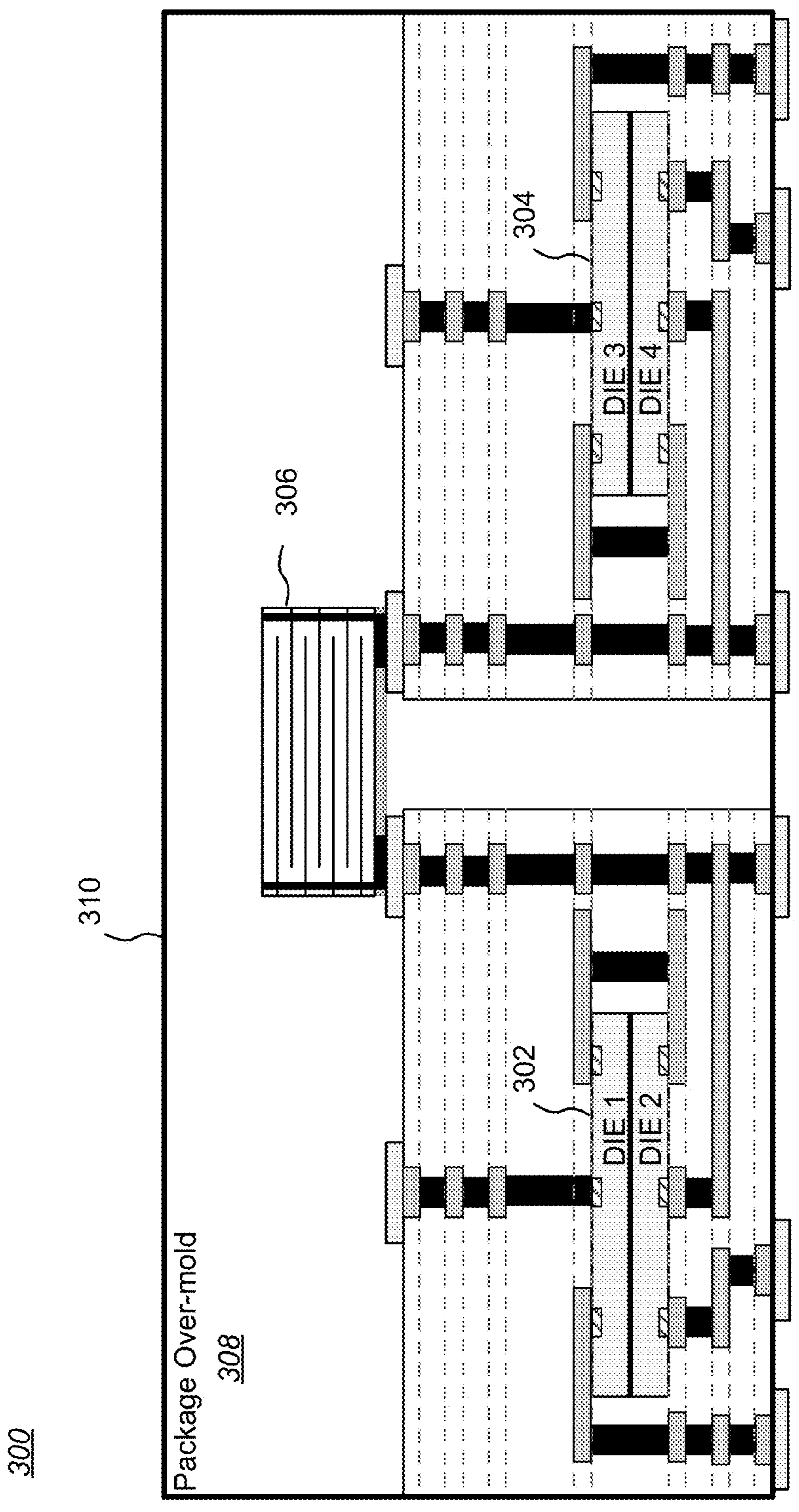
FIG. 3 is a cross-sectional side view of a 3-D IC structure that includes two side-by-side (horizontally spaced with respect to the page) 3-D IC dies.

The example 3-D IC structure 100 shown in FIG. 1A includes a single 3-D IC die 102. However, combining 3-D IC dies with embedded die packaging technology allows economies of scaling. For example, FIG. 3 is a cross-sectional side view of a 3-D IC structure 300 that includes two side-by-side (horizontally embedded and spaced with respect to the page) 3-D IC dies 302, 304. In the illustrated example, an MLCC 306 is coupled to both 3-D IC dies 302, 304, and the completed 3-D IC structure 300 is shown including an over-mold material 308 to form a robust CSP 310.

Figure 4:
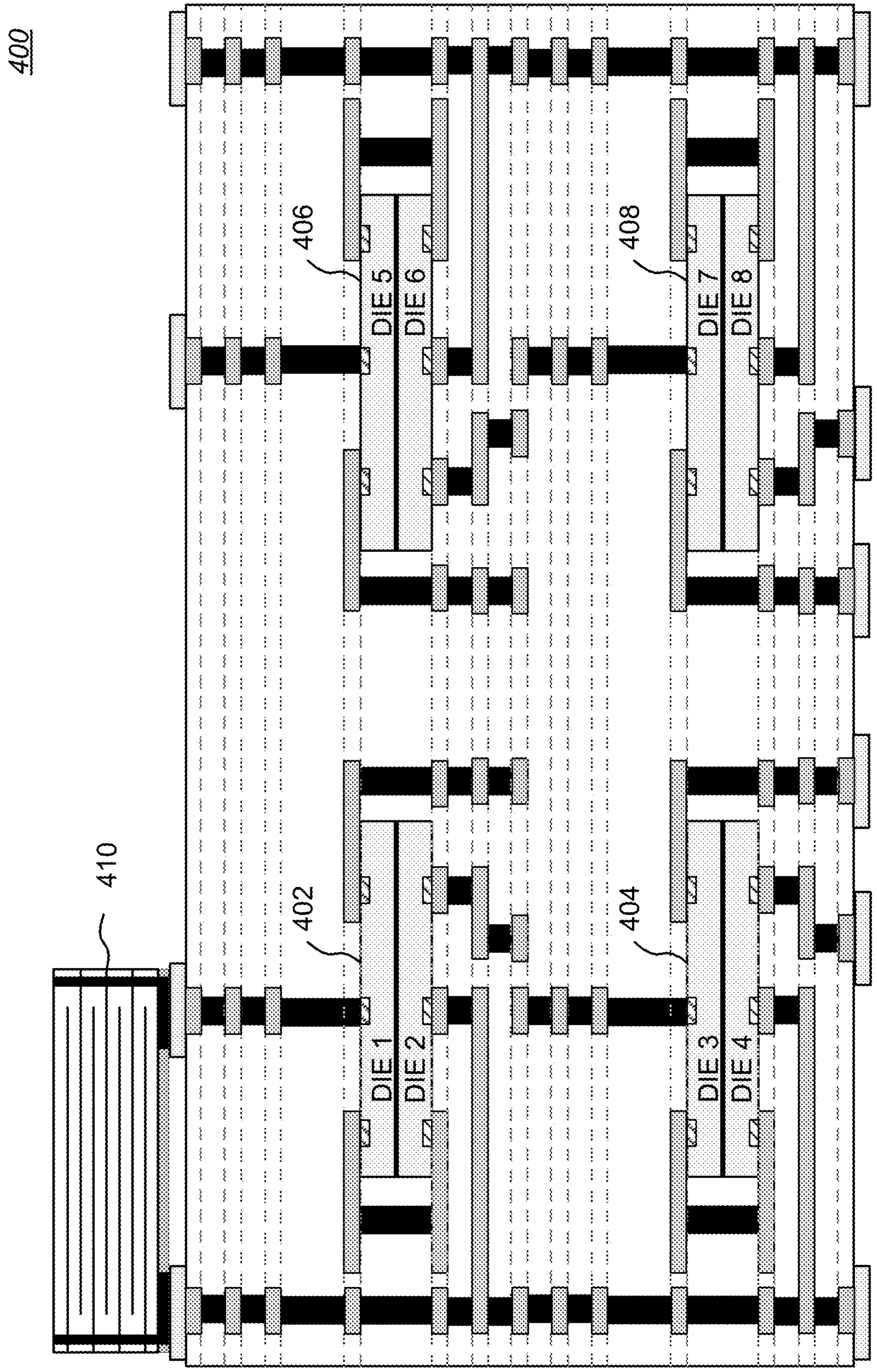
FIG. 4 is a cross-sectional side view of a 3-D IC structure that includes a first pair of side-by-side (horizontally spaced with respect to the page) 3-D IC dies vertically spaced from a second pair of side-by-side 3-D IC dies.

As another example, FIG. 4 is a cross-sectional side view of a 3-D IC structure 400 that includes a first pair of stacked (vertically spaced with respect to the page) 3-D IC dies 402, 404 horizontally spaced from a second pair of stacked 3-D IC dies 406, 408. In the illustrated example, an MLCC 410 is coupled to DIE 1 of 3-D IC die 402 and to DIE 4 of 3-D IC die 404. The completed 3-D IC structure 400 with attached external components may be embedded within over-mold material (not shown) to form a robust CSP.

As should be clear, the examples shown in FIGS. 3 and 4 are illustrative and not limiting. Thus, other numbers and layouts of 3-D IC dies 102 may be incorporated within a 3-D IC structure to meet the needs of a particular application. The realized chip-scale package may be embedded into or attached to another substrate (e.g., a motherboard substrate of a larger system).

Example Circuit Application

Figure 5:
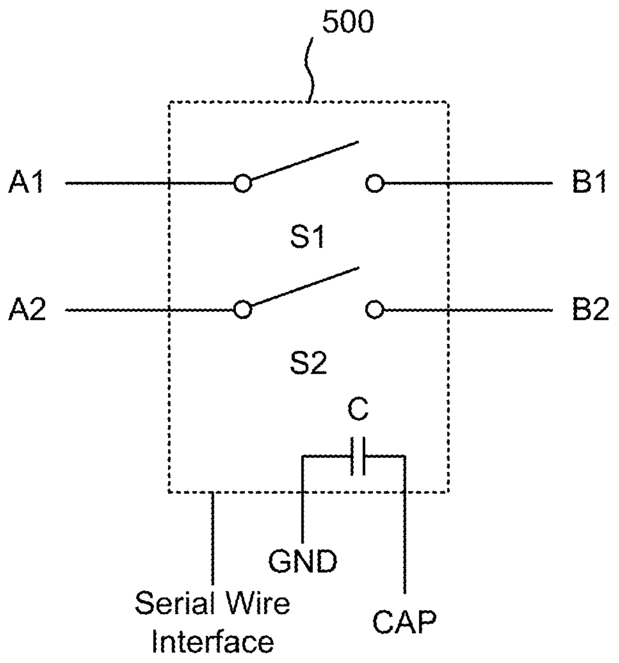
FIG. 5 is a schematic diagram of an integrated circuit radio frequency antenna switch that may be implemented using the present invention.

Applications of the present invention are numerous. For example, FIG. 5 is a schematic diagram of an integrated circuit radio frequency antenna switch 500 that may be implemented using the present invention. The antenna switch 500 includes a first switch S1 that can couple signals on port A1 to port B1, and a second switch S2 that can couple signals on port A2 to port B2. The OPEN or CLOSED states of both switches S1, S2 may be controlled by a conventional serial wire interface. Both switches S1, S2 may be implemented using MOSFETs. A circuit ground terminal GND provides a reference potential to the antenna switch 500.

It is common for an antenna switch to need at least one relatively large capacitor (e.g., 1.5 μF) for proper operation. In conventional antenna switches, such an external supply capacitor is coupled between a contact die-pad of the antenna switch IC and circuit ground. However, applying the present invention, the illustrated antenna switch 500 may be implemented as a single 3-D IC structure that includes an embedded capacitor C, as in the example shown in FIG. 1A, all with a compact 2-D footprint. Such an embodiment meets customer requirements for greater levels of integration and miniaturization as well as maintaining or reducing the resulting 2-D footprint compared to conventional IC implementations.

MLCC Fabrication Method

Regarding MLCCs of the type shown in the examples of this disclosure, one method of fabricating such MLCCs may be based on a combination of multi-layer ceramic capacitor (MLCC) and low temperature-co-firing-ceramic (LTCC) technology. For example, pre-milled ceramic dielectric powder may be mixed with a suitable amount of binder (typically an organic polymer) to make a dielectric "green" sheet. The ceramic powder may be, for example, barium titanate ($BaTiO_3$). Internal electrodes may be formed by printing (e.g., screen printing) a conductive paste (e.g., nickel) on the green sheet to form multiple sets of parallel capacitor plates. At a later stage, the sets of parallel capacitor plates can be separated (diced) to form individual discrete capacitors.

Multiple printed green sheets may then be stacked together and pressed (laminated). The number of stack layers and the total layer thickness are pre-determined to achieve a target capacitance value. Through-vias may be formed and then filled with a suitable conductor, such as copper or aluminum. Through-vias may be formed using a number of techniques, including laser drilling through the laminated stack. In alternative processes, through-vias may be formed before capacitor plate printing and stacking by punching holes through the green sheet and filling the holes with a conductor. A single discrete capacitor structure may be internally divided into an array of two or more capacitor cells or partitions, with the partitions being electrically isolated from each other.

Surface termination electrodes or pads may be printed to connect to the through-vias, and then the multi-layered laminated green sheet may be loaded into a furnace for binder burnout and sintering. The sintering temperature of $BaTiO_3$, prepared by a conventional mixed-oxide method, is in general considerably above 1200° ° C. to obtain dense ceramic bodies. Sintering temperatures of about 1100° C. are possible using nano-sized $BaTiO_3$ and a two-step sintering procedure. However, such temperatures are well above common IC fabrication temperatures, particularly for CMOS ICs (generally below about 300° C.).

In some processes, additional printing of conductors may be done. The individual capacitors may then be separated from each other, and electrically tested and screened for capacitance, dissipation factor, and intrinsic resistance values. In some processes, testing may occur before singulation.

As should be apparent, MLCC fabrication by means of stacking and laminating layers concurrently differs from semiconductor device fabrication, where layers are generally processed serially, with each new layer fabricated on previous layers.

As noted above, embodiments of the present invention are not limited to use of MLCC capacitors, but include other known capacitor structures, including (but not limited to), ceramic capacitors, tantalum capacitors, aluminum electrolytic capacitors, and conductive polymer capacitors.

Circuit Embodiments

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit components or blocks (e.g., filters, amplifiers, passive components, and possibly additional ICs) into one package. The ICs and/or modules are then typically combined with other components, often on a printed circuit board, to form part of an end-product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

Figure 6:
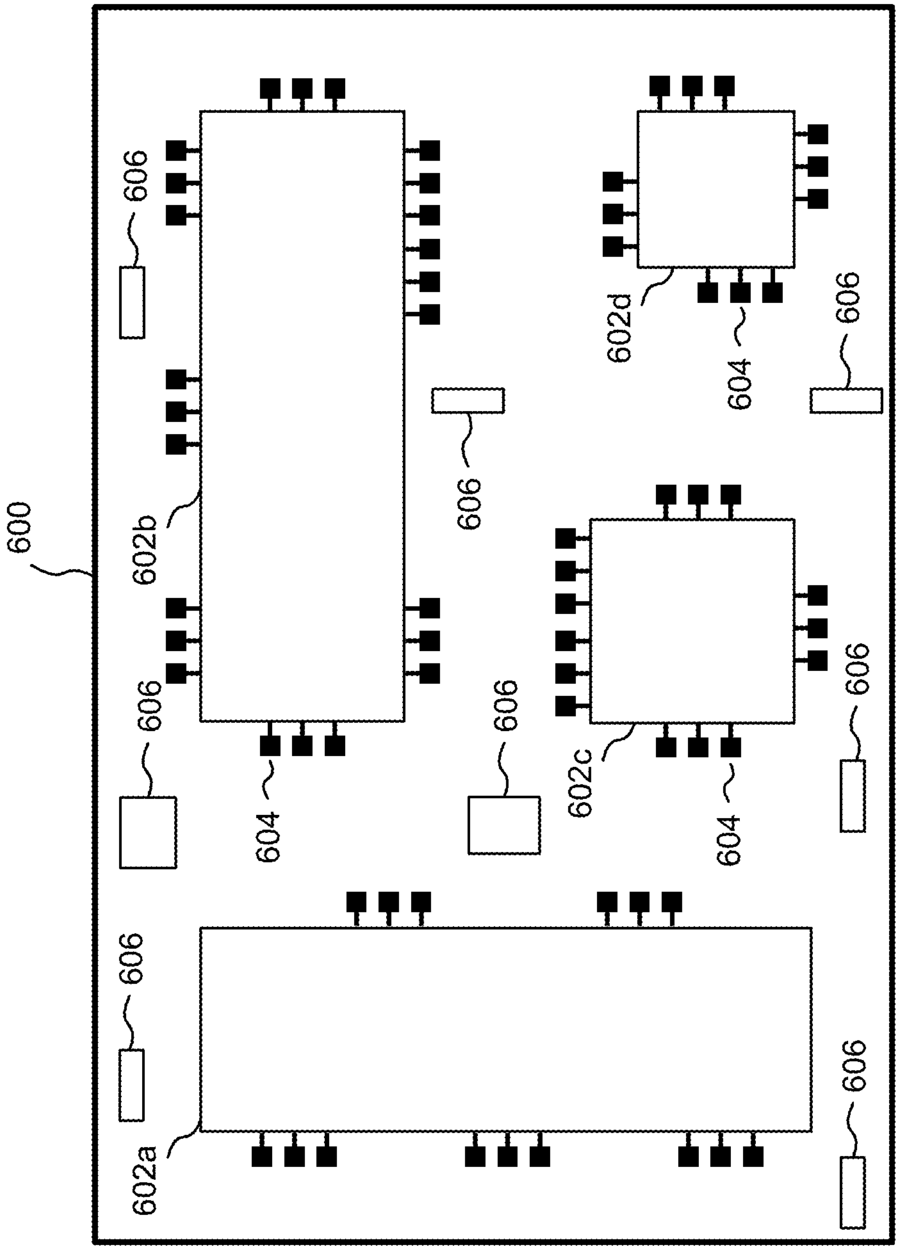
FIG. 6 is a top plan view of a substrate that may be, for example, a printed circuit board or chip module substrate (e.g., a thin-film tile).

As one example of further integration of embodiments of the present invention with other components, FIG. 6 is a top plan view of a substrate 600 that may be, for example, a printed circuit board or chip module substrate (e.g., a thin-film tile). In the illustrated example, the substrate 600 includes multiple ICs 602*a*-602*d* having terminal pads 604 which would be interconnected by conductive vias and/or traces on and/or within the substrate 600 or on the opposite (back) surface of the substrate 600 (to avoid clutter, the surface conductive traces are not shown and not all terminal pads are labelled). The ICs 602*a*-602*d* may embody, for example, signal switches, active filters, amplifiers (including one or more LNAs), and other circuitry, and may comprise 3-D IC structures in accordance with the present invention.

The substrate 600 may also include one or more passive devices 606 embedded in, formed on, and/or affixed to the substrate 600. While shown as generic rectangles, the passive devices 606 may be, for example, filters, capacitors, inductors, transmission lines, resistors, planar antennae elements, transducers (including, for example, MEMS-based transducers, such as accelerometers, gyroscopes, microphones, pressure sensors, etc.), batteries, etc., interconnected by conductive traces on or in the substrate 600 to other passive devices 606 and/or the individual ICs 602*a*-602*d*. The front or back surface of the substrate 600 may be used as a location for the formation of other structures.

System Aspects

Embodiments of the present invention are useful in a wide variety of larger radio frequency (RF) circuits and systems for performing a range of functions, including (but not limited to) impedance matching circuits, RF power amplifiers, RF low-noise amplifiers (LNAs), phase shifters, attenuators, antenna beam-steering systems, charge pump devices, RF switches, etc. Such functions are useful in a variety of applications, such as radar systems (including phased array and automotive radar systems), radio systems (including cellular radio systems), and test equipment.

Radio system usage includes wireless RF systems (including base stations, relay stations, and hand-held transceivers) that use various technologies and protocols, including various types of orthogonal frequency-division multiplexing ("OFDM"), quadrature amplitude modulation ("QAM"), Code-Division Multiple Access ("CDMA"), Time-Division Multiple Access ("TDMA"), Wide Band Code Division Multiple Access ("W-CDMA"), Global System for Mobile Communications ("GSM"), Long Term Evolution ("LTE"), 5G, 6G, and WiFi (e.g., 802.11a, b, g, ac, ax, be) protocols, as well as other radio communication standards and protocols.

The current invention enables 3-D IC structures within increased functionality that are less constrained by the 2-D footprint of a conventional IC die. Embodiments of the present invention enable smaller end-use products and shorter signal paths between IC dies, which may, for example, improve range, quality of reception, power usage, and bandwidth in radio frequency applications.

Methods

Figure 7:
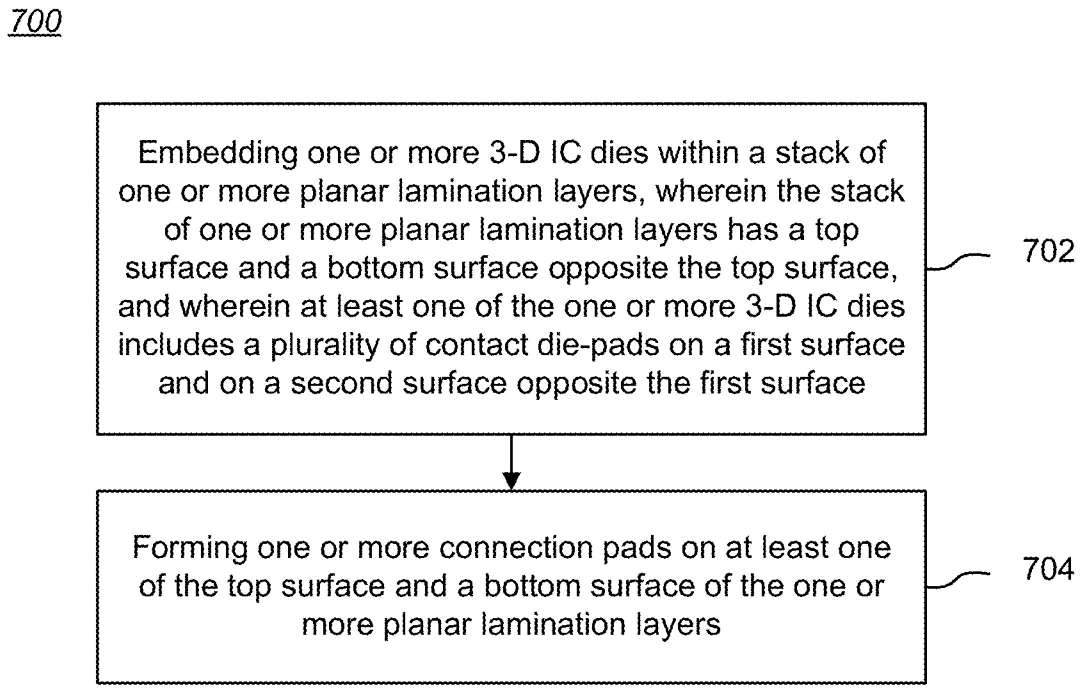
FIG. 7 is a process flow chart showing one method for fabricating a 3-D IC structure.

Another aspect of the invention includes methods for fabricating 3-D IC structures. For example, FIG. 7 is a process flow chart 700 showing one method for fabricating a 3-D IC structure. The method includes: embedding one or more 3-D IC dies within a stack of one or more planar lamination layers, wherein the stack of one or more planar lamination layers has a top surface and a bottom surface opposite the top surface, and wherein at least one of the one or more 3-D IC dies includes a plurality of contact die-pads on a first surface and on a second surface opposite the first surface (Block 702); and forming one or more connection pads on at least one of the top surface and a bottom surface of the one or more planar lamination layers.

Additional aspects of the above method may include one or more of the following: forming at least one conductive path within the one or more planar lamination layers connecting at least one of the plurality of contact die-pads to at least one of the one or more connection pads; attaching at least one electronic, electromechanical, and/or electro-optical component to at least one of the one or more connection pads; wherein the at least one component is a capacitor; wherein the at least one component is a multi-layer ceramic capacitor including interdigitated electrically-isolated internal electrodes, internal via-type main electrodes connected to respective sets of the internal electrodes, and connection pads located on a bonding surface of the multi-layer ceramic capacitor and connected to respective ones of the internal via-type main electrodes; wherein the at least one of the one or more 3-D IC dies comprises first and second 2-D IC dies each having a substrate, wherein the first and second 2-D IC dies are bonded together such that the substrate of the first 2-D IC die faces the substrate of the second 2-D IC die; wherein the substrate of at least one of the first and second 2-D IC dies is thinned before bonding; wherein the at least one of the one or more 3-D IC dies comprises first and second two-dimensional IC dies each having a substrate and a substructure/superstructure formed on the substrate, wherein the first and second 2-D IC dies are bonded together such that the substructure/superstructure of the first 2-D IC die faces the substrate of the second 2-D IC die; wherein the at least one of the one or more 3-D IC dies comprises first and second two-dimensional IC dies each having a substrate, a substructure formed on the substrate, and a superstructure formed on the substructure, wherein the first and second 2-D IC dies are bonded together such that the substructure of the first 2-D IC die faces the substrate of the second 2-D IC die and the substrate of the first 2-D IC die is removed; wherein the at least one of the one or more 3-D IC dies comprises a substrate having a first surface and a second surface opposite the first surface, wherein the first surface is processed to form a combined substructure/superstructure on the first surface and the second surface is processed to form a combined substructure/superstructure on the second surface; placing at least two 3-D IC dies horizontally spaced with respect to each other within the 3-D IC structure; and/or placing at least two 3-D IC dies vertically spaced with respect to each other within the 3-D IC structure.

Fabrication Technologies & Options

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions may be greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar junction transistors (BJTs), BiCMOS, LDMOS, BCD, GaAs HBT, GaN HEMT, GaAs pHEMT, MESFET, InP HBT, InP HEMT, FinFET, GAAFET, and SiC-based power device technologies, using 2-D, 2.5-D, and 3-D structures. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A three-dimensional (3-D) integrated circuit (IC) structure including one or more 3-D hybrid-bonded IC dies embedded within a stack of one or more lamination layers, wherein the 3-D IC structure includes a top surface and a bottom surface opposite the top surface, the 3-D IC structure further including:

(a) one or more connection pads formed on at least one of the top surface and a bottom surface of the 3-D IC structure; and (b) at least one electronic, electromechanical, and/or electro-optical component attached and electrically coupled to at least one of the one or more connection pads;

wherein at least one of the at least one electronic, electromechanical, and/or electro-optical component is a multi-layer ceramic capacitor including interdigitated electrically-isolated internal electrodes, internal via-type main electrodes connected to respective sets of the internal electrodes, and component connection pads located on a bonding surface of the multi-layer ceramic capacitor, and wherein the internal via-type main electrodes of the multi-layer ceramic capacitor are connected to respective ones of the connection pads of the 3-D IC structure through the component connection pads of the multi-layer ceramic capacitor.

2. The invention of claim 1, wherein at least one of the one or more 3-D hybrid-bonded IC dies includes a plurality of contact die-pads on a first surface and on a second surface opposite the first surface.

3. The invention of claim 2, wherein the 3-D IC structure further includes at least one conductive path connecting at least one of the plurality of contact die-pads to at least one of the one or more connection pads.

4. The invention of claim 1, wherein the at least one of the one or more 3-D hybrid-bonded IC dies comprises first and second two-dimensional (2-D) IC dies each having a substrate, wherein the first and second 2-D IC dies are hybrid bonded together such that the substrate of the first 2-D IC die faces the substrate of the second 2-D IC die.

5. The invention of claim 1, wherein the at least one of the one or more 3-D hybrid-bonded IC dies comprises first and second two-dimensional (2-D) IC dies each having a substrate and a substructure/superstructure formed on the substrate, wherein the first and second 2-D IC dies are hybrid bonded together such that the substructure/superstructure of the first 2-D IC die faces the substrate of the second 2-D IC die.

6. The invention of claim 2, wherein the at least one of the one or more 3-D hybrid-bonded IC dies comprises first and second two-dimensional (2-D) dies each having a substrate, a substructure formed on the substrate, and a superstructure formed on the substructure, wherein the first and second 2-D IC dies are hybrid bonded together such that the substructure of the first 2-D IC die faces the substrate of the second 2-D IC die and the substrate of the first 2-D IC die is removed.

7. The invention of claim 1, wherein the 3-D IC structure includes at least two 3-D hybrid-bonded IC dies horizontally spaced with respect to each other within the 3-D IC structure.

8. The invention of claim 1, wherein the 3-D IC structure includes at least two 3-D hybrid-bonded IC dies vertically spaced with respect to each other within the 3-D IC structure.

9. A three-dimensional (3-D) integrated circuit (IC) structure having a top surface and a bottom surface opposite the top surface, the 3-D IC structure including:

(a) one or more 3-D hybrid-bonded IC dies embedded within a stack of one or more planar lamination layers, wherein at least one of the one or more 3-D hybrid-bonded IC dies includes a plurality of contact die-pads on a first surface and on a second surface opposite the first surface;

(b) one or more connection pads formed on at least one of the top surface and a bottom surface of the 3-D IC structure; and (c) at least one electronic, electromechanical, and/or electro-optical component attached and electrically coupled to at least one of the one or more connection pads, wherein at least one of the at least one electronic, electromechanical, and/or electro-optical component is a multi-layer ceramic capacitor including interdigitated electrically-isolated internal electrodes, internal via-type main electrodes connected to respective sets of the internal electrodes, and component connection pads located on a bonding surface of the multi-layer ceramic capacitor, and wherein the internal via-type main electrodes of the multi-layer ceramic capacitor are connected to respective ones of the connection pads of the 3-D IC structure through the component connection pads of the multi-layer ceramic capacitor.

10. The invention of claim 9, wherein the 3-D IC structure further includes at least one conductive path connecting at least one of the plurality of contact die-pads to at least one of the one or more connection pads.

11. The invention of claim 9, wherein the at least one of the one or more 3-D hybrid-bonded IC dies comprises first and second two-dimensional (2-D) IC dies each having a substrate, wherein the first and second 2-D IC dies are hybrid bonded together such that the substrate of the first 2-D IC die faces the substrate of the second 2-D IC die.

12. The invention of claim 9, wherein the at least one of the one or more 3-D hybrid-bonded IC dies comprises first and second two-dimensional (2-D) IC dies each having a substrate and a substructure/superstructure formed on the substrate, wherein the first and second 2-D IC dies are hybrid bonded together such that the substructure/superstructure of the first 2-D IC die faces the substrate of the second 2-D IC die.

13. The invention of claim 9, wherein the at least one of the one or more 3-D hybrid-bonded IC dies comprises first and second two-dimensional (2-D) IC dies each having a substrate, a substructure formed on the substrate, and a superstructure formed on the substructure, wherein the first and second 2-D IC dies are hybrid bonded together such that the substructure of the first 2-D IC die faces the substrate of the second 2-D IC die and the substrate of the first 2-D IC die is removed.

14. The invention of claim 9, wherein the 3-D IC structure includes at least two 3-D hybrid-bonded IC dies horizontally spaced with respect to each other within the 3-D IC structure.

15. The invention of claim 9, wherein the 3-D IC structure includes at least two 3-D hybrid-bonded IC dies vertically spaced with respect to each other within the 3-D IC structure.

* * * * *